(12) United States Patent
Brücklmeier et al.

(10) Patent No.: US 6,563,729 B2
(45) Date of Patent: May 13, 2003

(54) CONFIGURATION FOR EVALUATING A SIGNAL WHICH IS READ FROM A FERROELECTRIC STORAGE CAPACITOR

(75) Inventors: Eric-Roger Brücklmeier, München (DE); Michael Bollu, München (DE); Tobias Schlager, Kumberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/127,616

(22) Filed: Apr. 22, 2002

(65) Prior Publication Data

US 2002/0181270 A1 Dec. 5, 2002

Related U.S. Application Data

(63) Continuation of application No. PCT/EP00/10349, filed on Oct. 20, 2000.

(30) Foreign Application Priority Data

Oct. 22, 1999 (EP) .............................................. 99121161

(51) Int. Cl.$^7$ ................................................ G11C 11/22

(52) U.S. Cl. ............................................ 365/145; 365/65
(58) Field of Search ................................ 365/145, 236, 365/65

(56) References Cited

U.S. PATENT DOCUMENTS 5,270,967 A * 12/1993 Moazzami et al. ......... 365/145
6,097,622 A * 8/2000 Shimizu et al. ............ 365/145

FOREIGN PATENT DOCUMENTS

JP    63 148 167 A    6/1988
JP    07 093 968 A    4/1995

* cited by examiner

*Primary Examiner*—Hoai Ho
(74) *Attorney, Agent, or Firm*—Laurence A. Greenberg; Werner H. Stemer; Ralph E. Locher

(57) ABSTRACT

A configuration is described for evaluating a signal that is read from a ferroelectric storage capacitor, in which, in addition to positive and negative polarization states, a weak polarization state is evaluated. Using the configuration, a data storage characteristic of the memory cells can be monitored, and a manipulation attempt can be detected.

5 Claims, 2 Drawing Sheets

CONFIGURATION FOR EVALUATING A SIGNAL WHICH IS READ FROM A FERROELECTRIC STORAGE CAPACITOR

CROSS-REFERENCE TO RELATED APPLICATION

This application is a continuation of copending International Application No. PCT/EP00/10349, filed Oct. 20, 2000, which designated the United States.

BACKGROUND OF THE INVENTION

Field of the Invention

The invention relates to a configuration for evaluating a signal that is read from a ferroelectric storage capacitor. The configuration has a read amplifier for amplifying the read signal, and an evaluating logic that is connected in series with the read amplifier.

As is generally known, owing to the characteristic hysteresis curve of the ferroelectric dielectric material of the storage capacitor, ferroelectric memories are non-volatile memories which are able to keep information long-term without the application of a supply voltage. In such ferroelectric memories, the information is stored in the form of a remanent polarization state of the ferroelectric dielectric material. Presently it is possible to store two states in this fashion, which are represented by a positive and a negative charge, respectively, and to which a "1" or "0" is allocated. Memory cells of such a memory are read by performing a comparison to a reference cell, whose state must be known. For instance, in memory cells formed of two transistors and two capacitors (2T2C cells), the reference cell polarization is always the opposite of the memory cell polarization.

The read amplifier that is connected in series with the ferroelectric memory works as a comparator that compares the charge quantity accepted in a memory cell being read to the charge quantity of the reference cell given the application of a read impulse. The cell whose polarization must be switched accepts the larger charge.

Taking the example of the 2T2C cell, if the memory cell carries a positive polarization, its reference cell has a negative polarization. If the memory cell is then read with a positive read impulse, the polarization of the reference cell inverts, whereas the state of the memory cell remains unchanged. Thus, in this case the reference cell accepts the larger charge compared to the memory cell. The resulting charge difference is then evaluated by the read amplifier.

If individual cells in a ferroelectric memory have insufficient data storage characteristics, or if a manipulation attempt is made, for instance by local or global temperature elevation, the dielectric materials of the affected cells lose part of their polarization, so that the cells tend to shift from both positive and negative polarization states to a "zero" polarization, or what is known as a zero state. If a memory cell and its reference cell are now in the zero state owing to a disturbance or a manipulation attempt, there is no longer an evaluatable polarization difference, and the signal at the output of the read amplifier is no longer predictably dependent upon factors such as tolerances which have nothing to do with the memory contents.

SUMMARY OF THE INVENTION

It is accordingly an object of the invention to provide a Configuration for evaluating a signal which is read from a ferroelectric storage capacitor which overcomes the above-mentioned disadvantages of the prior art devices of this general type, in which the data storage in the individual cells is monitored, and an attempted data manipulation in the form of a local or global thermal attack can be immediately detected.

With the foregoing and other objects in view there is provided, in accordance with the invention, a configuration for evaluating a signal that is read from a ferroelectric storage capacitor. The configuration contains a read amplifier for amplifying the signal read from the ferroelectric storage capacitor, an evaluation unit connected in series with the read amplifier, and a counter connected between the read amplifier and the evaluation unit. The counter receives and is charged by a clock signal. After the signal has been amplified by the read amplifier, the counter converts a pulse width of the signal into a corresponding count, and, from a level of the count, the evaluation unit determines whether the signal was read from a high positive polarization region, a high negative polarization region, or a weak polarization region of a storage medium of the ferroelectric storage capacitor.

The object is inventively achieved in the configuration of the above-mentioned type in that a counter, which is charged with a clock signal, is provided between the read amplifier and the evaluating logic. The counter converts the pulse width of the read signal, upon its amplification by the read amplifier, into a corresponding count value. The evaluating logic determines, from the level of the count value, whether the signal was read from a region of high positive polarization, high negative polarization, or weak polarization of the storage medium of the ferroelectric storage capacitor.

Thus, a "third evaluation state" (i.e. a weak polarization region) is introduced in the inventive configuration, which is situated on either side of the "zero state" and which can be excluded from evaluation. If the polarization state of the cell being read is within the third evaluation state, the read amplifier can deliver a signal signaling the invalidity of the output data without further ado. By evaluating additional circumstances by monitor cells, for example, the evaluation logic can then decide, without further ado, whether there is a data storage problem or a manipulation attempt when the third evaluation state is detected in the read amplifier.

The width of the third evaluation state is expediently set to be symmetrical relative to the "zero state". The read amplifier has an output for signaling the state.

It is advantageous when the width of the third evaluation state is adjustable, specifically by the read amplifier. It is then possible to optimally adapt a memory to the requirements under which it operates. A large width of the third evaluation state is advantageous above all when there is a danger of manipulation attempts, whereas a smaller width is sufficient for applications in which there is no such danger of manipulation attempts.

Lastly, according to the invention it is possible to realize a memory cell that can store 1.5 bits in a storage capacitor, because the memory states can be expressed by positive polarization, negative polarization and no polarization, so that the "zero state" can be utilized for storing a third information state. In any case, this requires a suitable circuit with which a cell can be put into a "zero state". This is possible by a depolarization circuit, in which the amplitude of a sinusoidal AC voltage at the cell is moved continuously downward.

Other features which are considered as characteristic for the invention are set forth in the appended claims.

Although the invention is illustrated and described herein as embodied in a configuration for evaluating a signal which is read from a ferroelectric storage capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
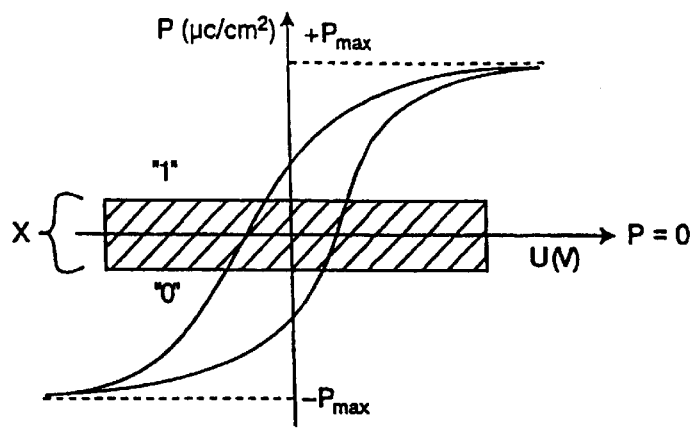
FIG. 1 is a graph of a hysteresis curve of a ferroelectric memory cell with different polarization states.

Referring now to the figures of the drawing in detail and first, particularly, to FIG. 1 thereof, there is shown a hysteresis curve in which the polarization P ($\mu$C/cm$^2$) is plotted as a function of the voltage U(V). A positive polarization P results in a logical "1", whereas a negative polarization is assigned a logical "0".

A zero polarization state is given as P=0. On either side of the zero state in its immediate vicinity, the state of a cell is difficult or impossible to evaluate. The invention therefore introduces a third evaluation state X that is signaled, but in whih an evaluation is not performed. If a quantity from region X is obtained in the evaluation of a memory cell, this indicates that a data manipulation has been attempted by thermal attack, or that the data storage characteristics of the memory are degraded.

Precisely whether a loss of data storage characteristics or an attempted data manipulation is the case can be determined by the evaluation logic when the additional information about the present condition of the memory is supplied. What is essential to the inventive configuration is above all the introduction of a third evaluation state, namely the region X, in the evaluation of the read signal of a ferroelectric cell.

Figure 2:
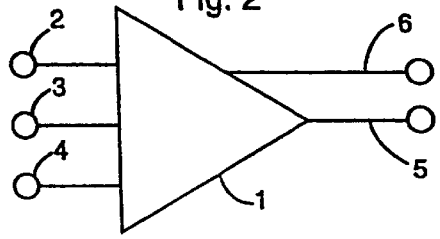
FIG. 2 is a basic circuit diagram laying out a read amplifier according to the invention.

FIG. 2 represents a block circuit diagram of a read amplifier 1, which can pick up several levels. The read amplifier 1 has an input 2 for an output signal of a memory cell, an input 3 for an output signal of a reference cell, and an additional input 4 with which the read amplifier 1 can be supplied with an input signal with which a width of region X above and below the line P=0 (see FIG. 1) can be set. With this adjustability of the read amplifier 1, the inventive configuration can be optimally adapted to the requirements under which it operates, for instance being set for high or low security against manipulation attempts.

Furthermore, by actuating the input 4 it is possible to perform a distribution of the achievable cell polarizations directly in the memory, i.e. on chip. This latter function can facilitate extensive monitoring particularly during the development phase of memories.

The read amplifier 1 also has an output terminal 5 and an output terminal 6, which emits a signal when, upon evaluation of the signals which are supplied via the input terminals 2, 3, it is determined that one of these signals results from region X. This way it is possible to signal the invalidity of the output data immediately without further ado.

Figure 3:
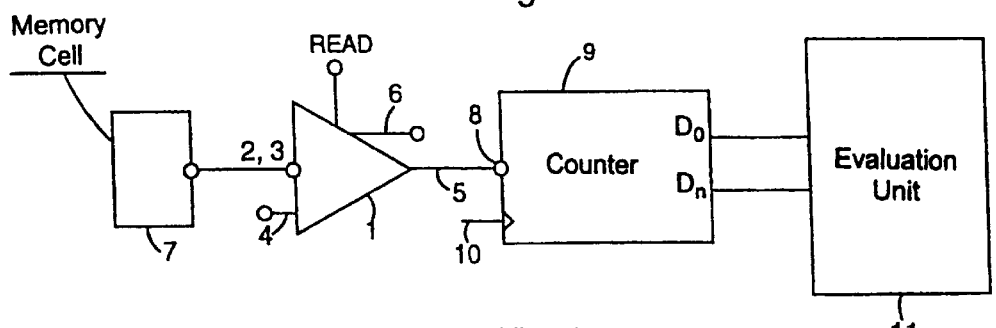
FIG. 3 is a block circuit diagram of the configuration according to the invention.
Figure 4:
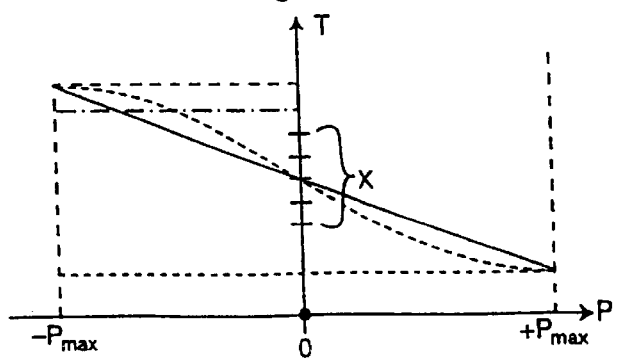
FIG. 4 is a graph laying out the functioning of the read amplifier in an evaluation of a signal that is read from a memory cell.

FIG. 3 represents a block circuit diagram of the inventive configuration with a memory, i.e. a memory cell 7, and, connected in series with this via an additional read output READ, the read amplifier 1. The output terminal 5 of the read amplifier 1 is connected to a counter enable terminal (i.e. count enable 8) of a counter 9, at whose clock input terminal 10 is a clock signal. The counter 9 counts the clock pulses supplied via the clock terminal 10 as long as an output signal from the read amplifier 1 is supplied to the clock enable terminal 8. Via output terminals $D_0$ to $D_n$ of the counter 9, the results obtained are fed to evaluation electronics 11, which then determine—from the pulse width, which was acquired by the counter 9, of the output signal of the read amplifier 1—whether or not a polarization in region X has been evaluated. The evaluation is schematically represented in FIG. 4, in which the polarization P is plotted on the abscissa, whereby the values +$P_{max}$ and −$P_{max}$ correspond to values that are allocated to the "peaks" of the hysteresis curve (see FIG. 1). If the pulse width is within the region X, this indicates the occurrence of a data storage problem or a manipulation attempt. On the other hand, given pulse widths outside the region X, there are no data storage problems or manipulation attempts.

Figure 5:
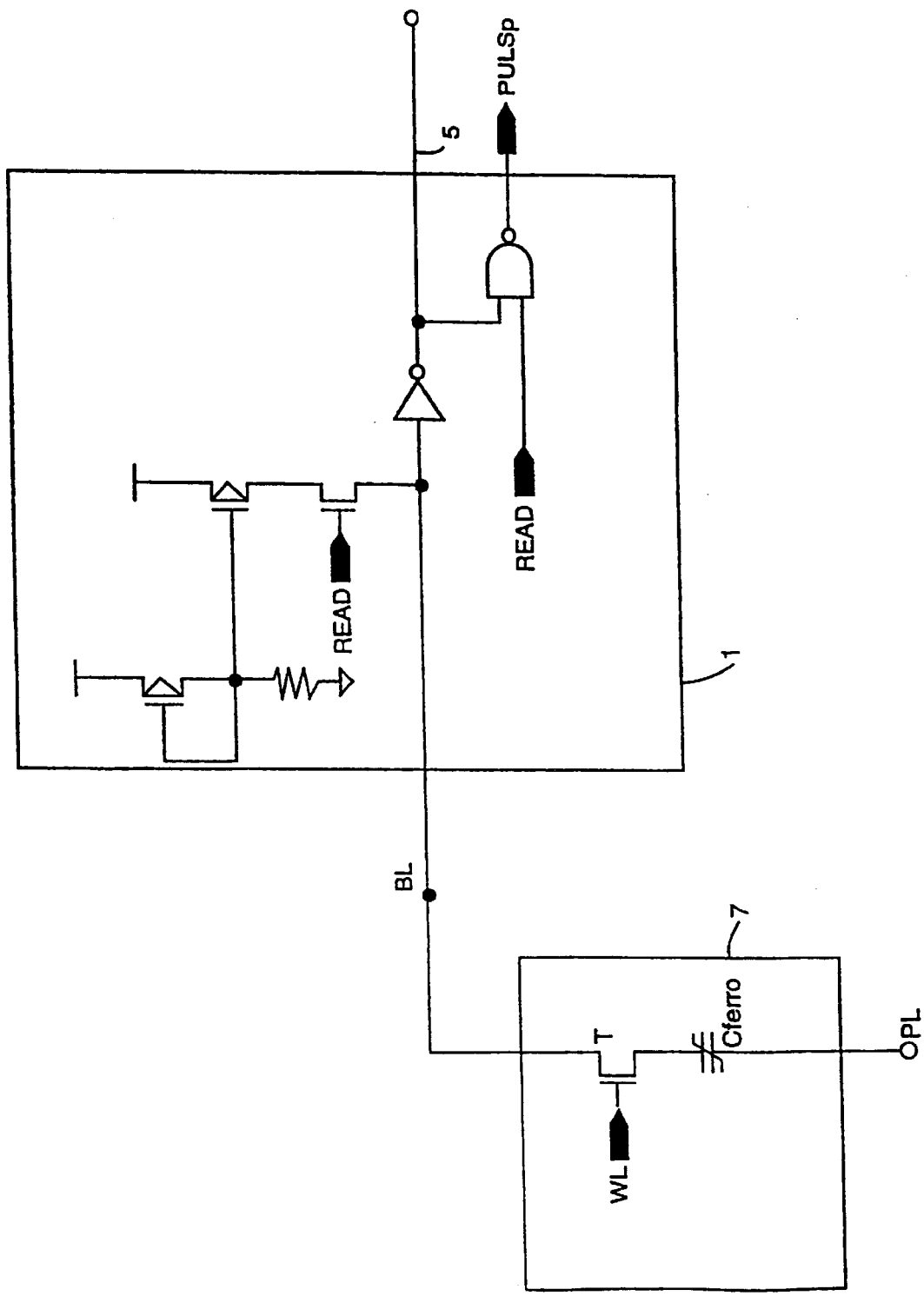
FIG. 5 is a schematic diagram of a concrete circuit example for the inventive configuration.

Lastly, FIG. 5 represents a concrete example of the memory cell 7 and the read amplifier 1. The memory cell 7 contains a ferroelectric storage capacitor Cferro at one of whose electrodes there is a plate voltage PL, while the other electrode of the capacitor Cferro is connected to a selection transistor T, whose gate electrode is connected to a word line WL. The output of the selection transistor is connected via a bit line BL to the read amplifier 1, which is constructed in the usual fashion from n-channel and p-channel MOS transistors, resistors, an inverter and an NAND gate.

The memory cell 7 is selected by activation of the word line WL. The memory cell 7 is read by activation of the read line READ. Depending on the polarization state of the storage capacitor Cferro, a negative voltage impulse that emerges at a terminal PULSp has different lengths.

We claim:

1. A configuration for evaluating a signal that is read from a ferroelectric storage capacitor, the configuration comprising:

a read amplifier for amplifying the signal read from the ferroelectric storage capacitor;

an evaluation unit connected in series with said read amplifier; and a counter connected between said read amplifier and said evaluation unit, said counter receiving and being charged by a clock signal, after the signal has been amplified by said read amplifier said counter converts a pulse width of the signal into a corresponding count, and, from a level of the count, said evaluation unit determines whether the signal was read from a high positive polarization region, a high negative polarization region, or a weak polarization region of a storage medium of the ferroelectric storage capacitor.

2. The configuration according to claim 1, wherein a width of the weak polarization region in said read amplifier is adjustable.

3. The configuration according to claim 2, wherein the weak polarization region can be evaluated as an additional information state.

4. The configuration according to claim 1, wherein said read amplifier has an additional output for signaling a weak polarization state.

5. The configuration according to claim 2, wherein the weak polarization region is situated symmetrically about a zero polarization state.

* * * * *